United States Patent [19]
Raber

[11] Patent Number: 5,843,584
[45] Date of Patent: Dec. 1, 1998

[54] SUPERCONDUCTIVE ARTICLE AND METHOD OF MAKING

[75] Inventor: Thomas Robert Raber, East Berne, N.Y.

[73] Assignee: General Electric Company, Schenectady, N.Y.

[21] Appl. No.: 415,969

[22] Filed: Apr. 3, 1995

[51] Int. Cl.⁶ .................................................. G12B 17/02
[52] U.S. Cl. .......................... 428/594; 428/636; 428/930; 505/813; 505/925; 505/927; 174/125.1
[58] Field of Search ............................. 29/599; 505/925, 505/812, 813, 918, 919, 927; 428/594, 607, 636, 930; 174/35 MS, 125.1, 125.2

[56] References Cited

U.S. PATENT DOCUMENTS

| | | | |
|---|---|---|---|
| 3,416,917 | 12/1968 | De Sorbo | 75/174 |
| 3,429,032 | 2/1969 | Martin et al. | 29/599 |
| 3,537,827 | 11/1970 | Benz et al. | 29/194 |
| 3,661,639 | 5/1972 | Caslaw | 117/213 |
| 3,895,432 | 7/1975 | Diepers et al. | 29/599 |
| 5,082,164 | 1/1992 | Rumaner et al. | 505/925 X |
| 5,109,593 | 5/1992 | Benz et al. | 29/599 |
| 5,134,040 | 7/1992 | Benz et al. | 428/646 |
| 5,239,156 | 8/1993 | Jones et al. | 219/121.63 |
| 5,253,413 | 10/1993 | Dorri et al. | 29/599 |
| 5,571,602 | 11/1996 | Eckels et al. | 29/599 X |
| 5,656,380 | 8/1997 | Raber et al. | 29/599 X |

OTHER PUBLICATIONS

Pending U.S. Patent Application Ser. No. 08/406,443, filed Mar. 20, 1995, by Thomas R. Raber, entitled "Superconductive Article and Method of Making".

Pending U.S. Patent Application Ser. No. 08/505,937, filed Jul. 24, 1995, by Thomas R. Raber et al., entitled "Superconductive Article and Method of Making".

Caslaw, J.S. "Enhancement of the critical current density in niobium–tin". Cryogenics, Feb. 1971.

Benz, M..G. "Superconducting Properties of Diffusion Processed Niobium–Tin Tape, IEEE, vol. Mag–2, No. 4, Dec. 1966.

M.G. Benz et al. "Melt–Formed Superconducting Joints for $Nb_3Sn$ Tape. Journal of Electronic Materials, vol. 22, No. 10, 1993.

*Primary Examiner*—Joseph M. Gorski
*Attorney, Agent, or Firm*—Ernest G. Cusick; Noreen C. Johnson

[57] ABSTRACT

A superconductive article is made from interconnected superconductive, metallic tapes. The tapes are mechanically joined, and electrically interconnected by a plurality of superconductive interconnections that extend between the tapes. Articles of the invention may be formed from tapes comprising superconductive $Nb_3Sn$ having $Nb_3Sn$ interconnections.

6 Claims, 6 Drawing Sheets

SUPERCONDUCTIVE ARTICLE AND METHOD OF MAKING

FIELD OF THE INVENTION

This invention is related generally to articles made from metallic superconductors. Specifically, this invention comprises superconductive metallic articles that are formed from mechanically joined and electrically interconnected superconductive, metallic tapes. The invention also comprises a method of making such articles.

BACKGROUND OF THE INVENTION

Superconductivity is that characteristic of certain materials which permits them to conduct electric currents without resistance. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, a superconductive material can be quenched (i.e. returned to a resistive state) by increasing the temperature, magnetic field, or current to which the material is subjected above the critical temperature, critical magnetic field, or critical current. In a given material, quenching of the superconductivity may occur abruptly or more gradually depending upon the breadth of its superconducting transition state with respect to temperature, magnetic field or current.

Briefly stated, with regard to metallic superconductors it is known that selected parent-metals, either pure or preferably containing minor solute-metal alloying additions, are capable of being alloyed with other reactive-metals and forming superconducting compounds or alloys that have a high current-carrying capacity. The parent-metals niobium, tantalum, technetium, and vanadium can be reacted or alloyed with reactive-metals, such as tin, aluminum, silicon, and gallium to form superconducting alloys, such as the intermetallic $Nb_3Sn$.

Additionally, it is known that the superconductive characteristics of various parent-metals can be improved by first alloying the parent-metal, i.e., niobium, tantalum, technetium, and vanadium, with a minor amount of a solute-metal having an atom diameter of at least 0.29 angstroms larger than the diameter of the parent-metal atom prior to reacting the reactive-metal with the parent-metal. A broad disclosure of various parent-metals, solute- metals, and reactive-metals can be found in U.S. Pat. No. 3,416,917, which is incorporated herein by reference. Of the various possible combinations of the materials mentioned above, it is known that niobium is an extremely useful parent-metal, particularly when reacted with the reactive-metal, tin to form $Nb_3Sn$. This intermetallic compound has superior superconducting properties. More specifically, U.S. Pat. No. 3,429,032, which is incorporated herein by reference, discloses improved critical currents in superconductive $Nb_3Sn$ alloys formed when the parent-metal niobium also contains zirconium, in an amount of at least 0.1 weight percent and up to an amount equivalent to the ratio represented by the formula $Nb_2Zr$, and is heated in the presence of excess tin, and a non-metal selected from the group consisting of oxygen, nitrogen, and carbon.

Metallic superconductors, particularly those comprising $Nb_3Sn$, have been fabricated in various forms, particularly wires and tapes, in efforts to produce devices such as high field superconducting electromagnets. Superconductive metallic devices of laminated construction having an elongated tape or strip configuration and the methods of producing such superconductive tapes are well known. For example, British patent 1,254,542 incorporated by reference herein, discloses improved superconducting tapes, and methods of forming the improved tapes. U.S. Pat. No. 3,537,827, incorporated by reference herein, discloses improvements in laminating superconductive tapes and methods for producing the laminated tapes. One method for obtaining superconducting tape in a continuous fashion is that wherein a tape of a preselected parent-metal, such as niobium or niobium alloy, (e.g. an Nb-Zr alloy) is continuously led through a bath of molten reactive-metal such as tin or a tin alloy, such as a tin-copper alloy. The niobium tape picks up a thin coating of the reactive-metal from the molten bath and the tape is subsequently heated in a reaction furnace to cause formation of the superconductive $Nb_3Sn$ alloy on the surface of the parent-metal tape. It is also known that the reactive-metals can be alloyed to further improve the superconductive tape. For example, the critical current density of triniobium tin has been improved by making copper additions of up to 45 weight percent copper in the reactive-metal tin for coating on niobium tape as disclosed in, "Enhancement of the Critical Current Density in Niobium-Tin" J. S. Caslaw, Cryogenics, February 1971, pp. 57–59.

Methods for making superconductive joints between superconductive tapes, such as triniobium tin tapes, are well-known as described in U.S. Pat. Nos. 5,109,593 and 5,134,040. However, most of the development of fabrication techniques related to superconductive tapes has been directed toward joining techniques for forming continuous lengths of wire or tape. It is also desirable to form larger superconductive articles from these tapes. For example, larger superconductive articles made from these superconductive tapes could be used for electromagnetic shielding for applications which must be isolated from large magnetic fields. One desirable application might be as a passive shield for the gradient coil in a magnetic resonance imaging (MRI) apparatus. As is known, in MRI apparatuses superconductive gradient coils generate large magnetic fields in an annular imaging chamber. It is known that these magnetic fields also extend outside the ends of the annular chamber and bend back onto the MRI apparatus, including the gradient coils. Because these stray magnetic fields affect performance of the MRI, it is desirable to provide magnetic shielding around the exterior of the gradient coils. Because of the significant strength of these stray fields and other system constraints such as the desire to minimize the overall system size and minimize the required cooling capacity required for the shield, it would be desirable to form such shielding from a superconductive material. For example, a large 1–2 m diameter superconductive right circular cylinder having a length of about 1–3 m would be a desirable configuration for surrounding an MRI gradient coil. However, once a superconductive metallic tape is reacted to form the superconductive material, it is known that they become relatively brittle due to the brittle nature of the $Nb_3Sn$ intermetallic compound that is formed.

Therefore, it is also desirable to develop methods for forming superconductive articles from superconductive tapes that accommodate the brittle characteristics of these materials in their reacted state.

SUMMARY OF THE INVENTION

This invention describes superconductive articles that are formed from interconnected superconductive tapes, such as those comprising $Nb_3Sn$. The invention also comprises a method of making such articles.

The present invention may be described as a superconductive article, comprising: a first metallic tape comprising a first superconductive portion and having a plurality of integrally formed tabs extending from an inner edge; a second metallic tape comprising a second superconductive portion and having a flat edge, wherein the flat edge of said second metallic tape abuts the inner edge of said first metallic tape and is woven in an alternating over/under pattern between the integrally formed tabs; means for joining said first tape and said second tape; and means for electrically connecting said first and second tapes with superconductive electrical connections, wherein the joined and electrically connected first and second tapes comprise a superconductive article.

One method of making these superconductive articles, may be described as comprising the steps of: selecting a first metallic precursor tape having a plurality of integrally formed tabs extending from an inner edge and a second metallic precursor tape having a flat edge; placing said first precursor tape together with said second precursor tape so that a plurality of portions of the flat edge of said second precursor tape abut the inner edge of said first precursor tape and said second precursor tape is woven in an alternating over/under pattern between the integrally formed tabs of said first precursor tape; and heating the first precursor tape and the second precursor tape together at a temperature and for a time sufficient to cause them to form a first tape having a first superconductive portion, a second tape having a second superconductive portion, a plurality of superconductive butt joints, electrically connecting the first superconductive portion and the second superconductive portion where the inner edge of the first tape and the flat edge of the second tape abut, and a plurality of metallurgical bonds between the plurality of integrally formed tabs and the second tape.

A principal advantage of the present invention is that it permits the creation of superconductive articles that are larger than those that may be fashioned from a single superconductive tape.

DETAILED DESCRIPTION OF THE INVENTION

This invention describes a superconductive article that is formed by mechanically joining and electrically interconnecting a plurality of superconductive tapes. Articles of the present invention comprise a plurality of superconductive tapes which abut one another along their edges where they are mechanically joined and electrically interconnected by a means for joining and a means for electrically connecting. Superconductive articles of the present invention may be made in a variety of shapes and sizes including flat, planar arrays and shapes that may be formed from such arrays, such as a hollow right circular cylinder.

Figure 1:
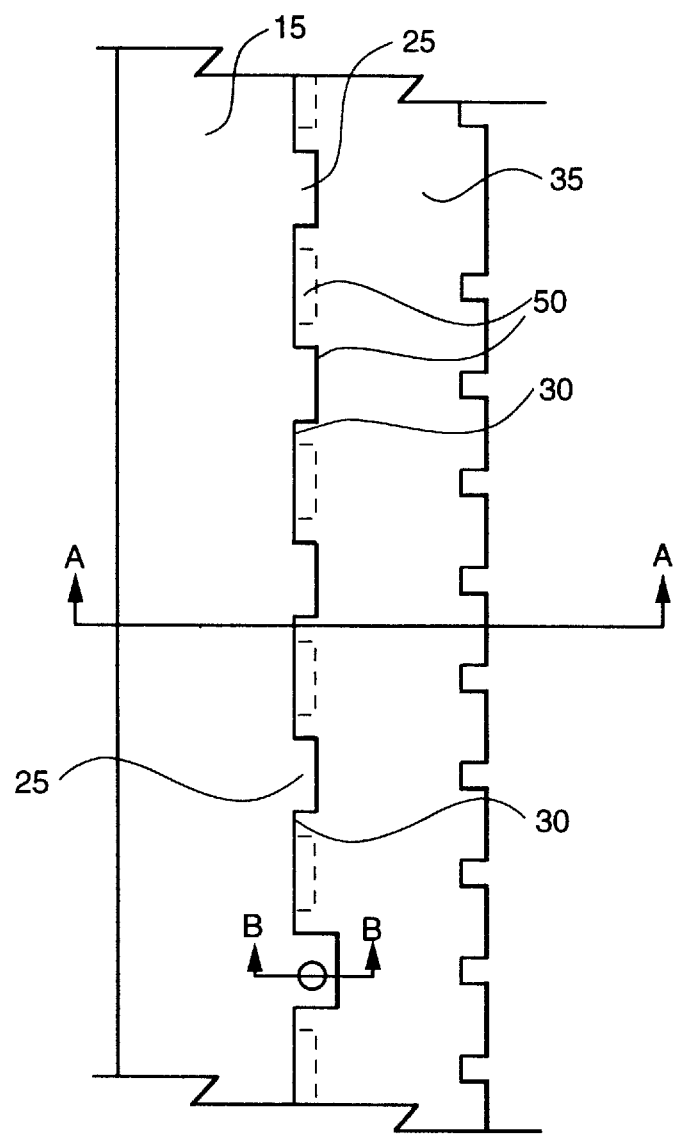
FIG. 1 is an illustration of a top view of mechanically joined and electrically interconnected tapes forming an article of the present invention.
Figure 1A:
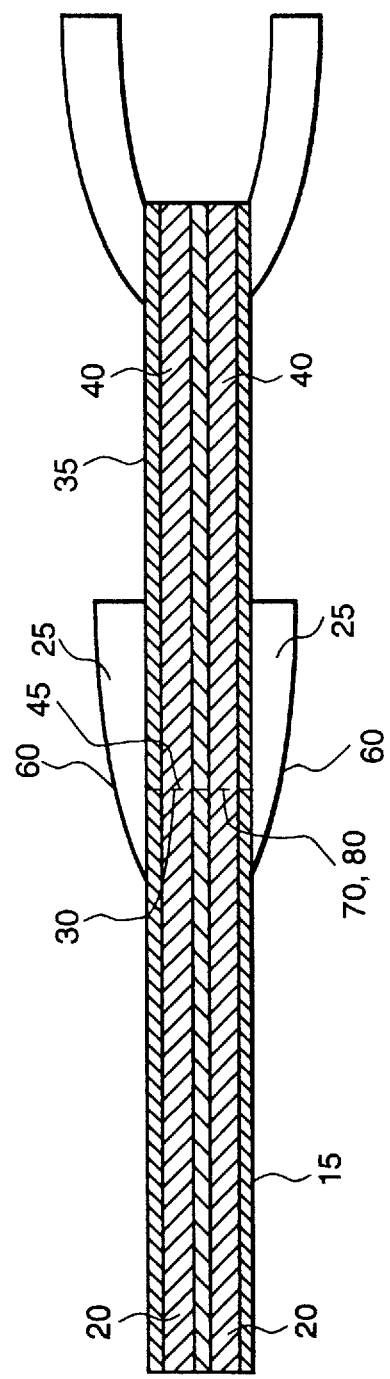
FIG. 1A is a cross-sectional view of the article of FIG. 2 taken along section line AA.
Figure 1B:
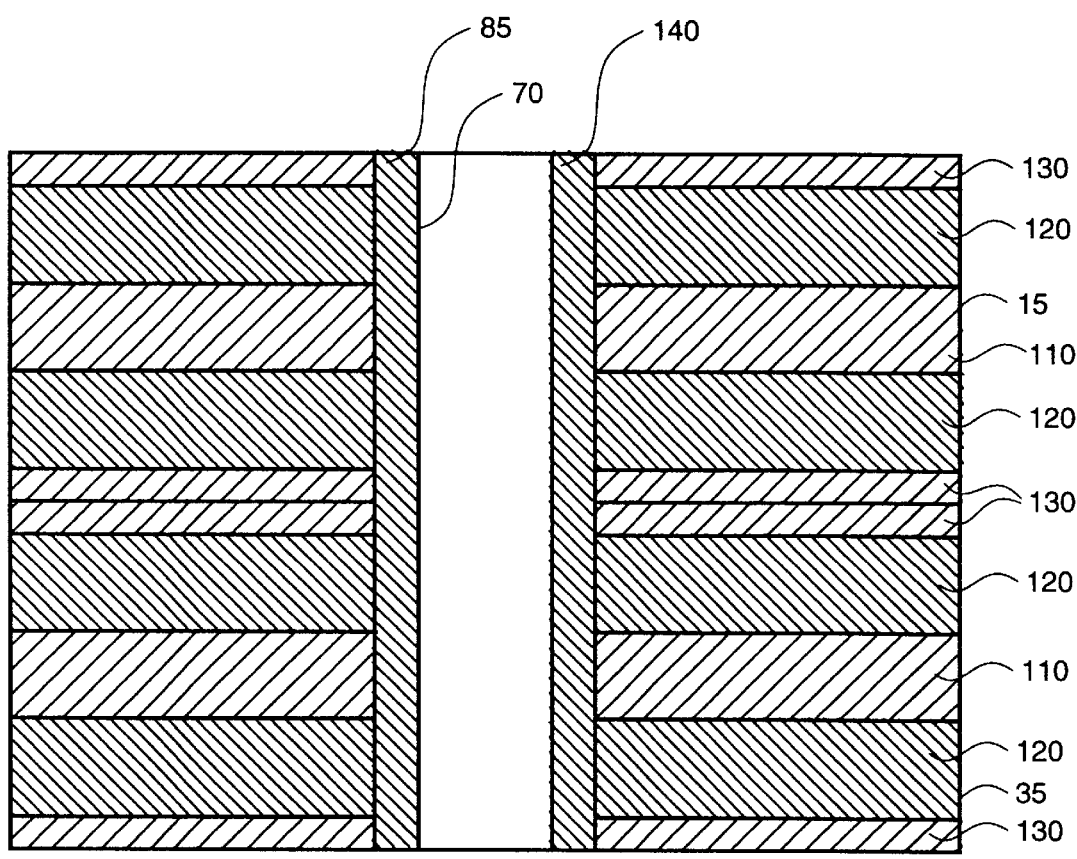
FIG. 1B is a cross-sectional view of the article of FIG. 2 taken along section line BB.

FIGS. 1, 1A and 1B illustrate one embodiment of a superconductive article 10 of the present invention in the form of a flat, planar array. Superconductive article 10 comprises: a first metallic tape 15 comprising a first superconductive portion 20 and having a plurality of integrally formed tabs 25 extending from an inner edge 30; a second metallic tape 35 comprising a second superconductive portion 40 and having a flat edge 45; wherein the flat edge 45 of said second metallic tape 35 abuts the inner edge 30 of said first metallic tape 15 and is woven in an alternating over/under pattern 50 between the integrally formed tabs 25; means for joining 60 said first tape 15 and said second tape 35; and means for electrically connecting 70 said first tape 15 and second 35 tapes with superconductive electrical connections 80, wherein the joined and electrically connected first 15 and second 35 tapes comprise a superconductive article 10.

First tape 15 and second tape 35 are metallic superconductors of a type well known in the art. They may comprise any superconductive metallic material, but are preferably from the group consisting of niobium-base, tantalum-base, technetium-base and vanadium-base alloys with at least one alloy constituent from the group consisting of tin, aluminum, silicon and gallium. Tapes comprising the superconductive metallic material $Nb_3Sn$ are preferred, primarily due to the commercial availability and superconductive characteristics of this material, and are used herein as the illustrative embodiment of the present invention. Applicants believe that for most applications, it is preferred that first tape 15 and second tape 35 also comprise the same superconductive metallic material.

Figure 2:
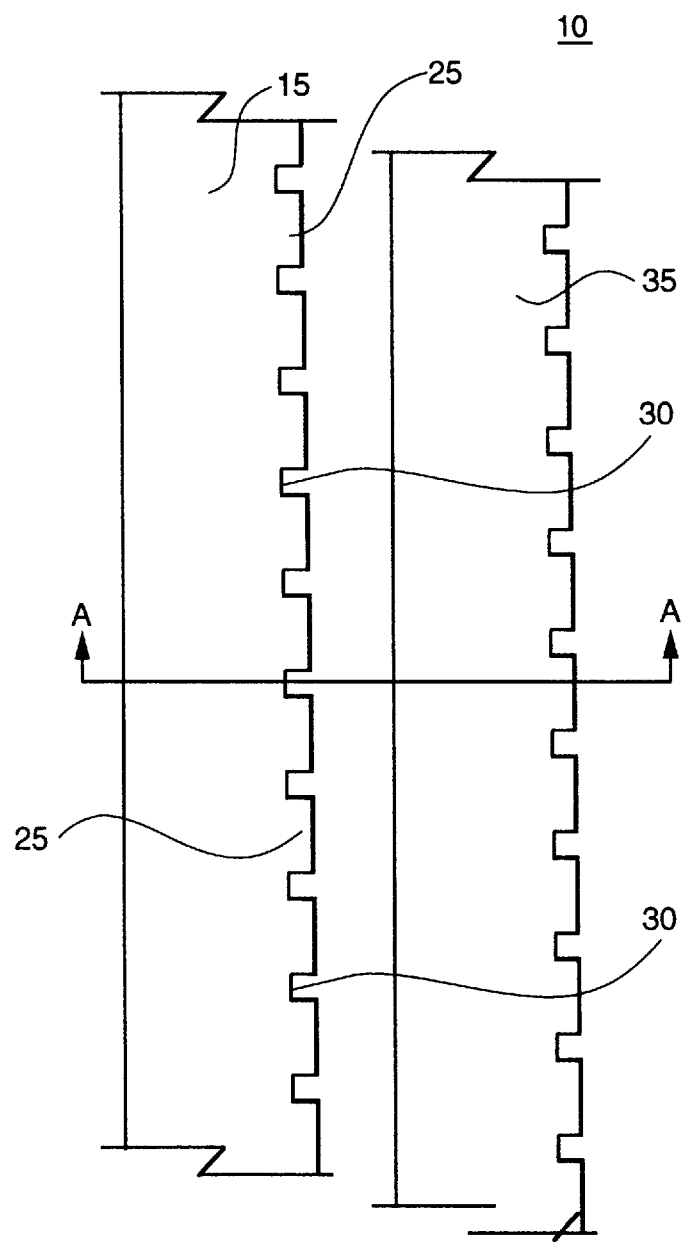
FIG. 2 is an illustration of a top view of superconductive tapes used to make an article of the present invention.
Figure 2A:
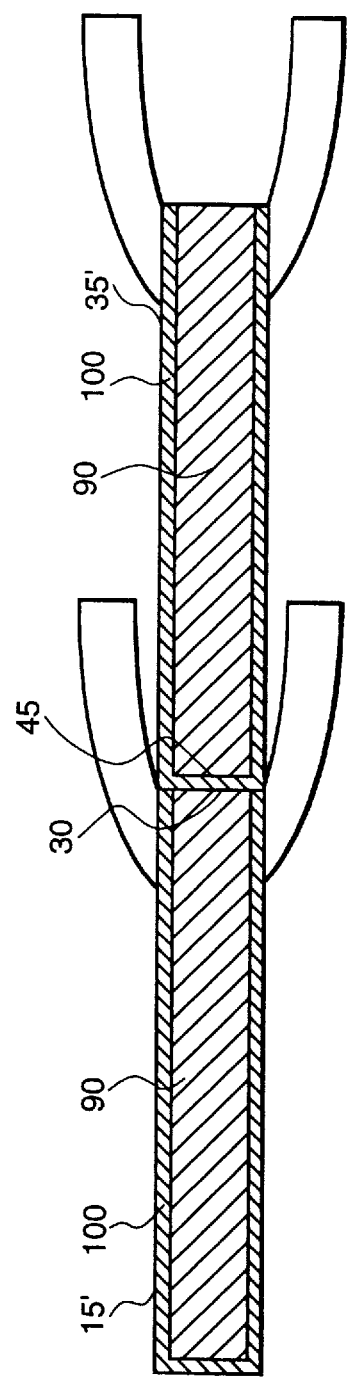
FIG. 2A is a cross-sectional view of the tapes of FIG. 1 taken along section line AA.

Superconductive $Nb_3Sn$ tapes are well known in the art being described, for example, in "Superconducting Properties of Diffusion Processed Niobium-Tin Tape", M. Benz, I.E.E.E. Transactions of Magnetics, Vol. Mag-2 No. 4, December 1966, pp. 760–764. Superconductive $Nb_3Sn$ tapes are formed from precursor tapes that comprise niobium coated with tin. FIGS. 2 and 2A illustrate first precursor tapes 15' and second precursor tapes 35' that each comprise a niobium-base tape 90 and a tin or a tin alloy reactive-metal coating 100. The parent-metal niobium-base tape 90 also typically has solute-metal additions of zirconium (not shown). Niobium-base tape 90 is preferably an alloy of up to about 5 atomic percent zirconium, up to about 10 atomic percent oxygen and a balance of niobium, and most preferably an alloy of about 1 atomic percent zirconium, 2 atomic percent oxygen and a balance of niobium. The addition of zirconium and oxygen are known to improve the critical current density in the resulting $Nb_3Sn$. Tin coating 100 may be a pure tin coating, but is preferably a tin-copper alloy coating comprising up to about 45 atomic percent copper and the balance tin, excepting impurities, and is most preferably an alloy coating comprising about 32 atomic percent copper and the balance tin, excepting impurities. Tin or tin alloy coating 100 is frequently applied to both sides of the niobium-base tape 90 by passing the tape through a melt of the tin or tin alloy. This tin-coated niobium-base tape is referred to as an "unreacted tape", and is designated in FIG. 2 as first precursor tape 15' and second precursor tape 35'. These unreacted tapes require an additional reactive step to form the superconductive $Nb_3Sn$.

The reactive step is typically an anneal in an argon atmosphere at a temperature of about 950°–1150° C. Depending on factors such as the thickness of the unreacted niobium-base tape and the desired thickness of the $Nb_3Sn$ reaction layers, the reaction may require 2–5 minutes or more. FIGS. 1A and 1B illustrate reacted tapes in the form of first tape 15 and second tape 35. A typical example of a reacted tape has a thickness of about 33 microns. This includes a core 110 of the remaining parent-metal niobium-base alloy having a thickness of about 11 microns, a layer of $Nb_3Sn$ 120 on either side of the core 110 having a thickness of about 8 microns and a layer 130 of the unreacted tin or tin alloy covering both of the $Nb_3Sn$ 120 layers having a thickness of about 3 microns. Having described how superconductive first tape 15 and second tape 35 are formed, superconductive article 10 and a method of making this article are now described.

Figure 3:
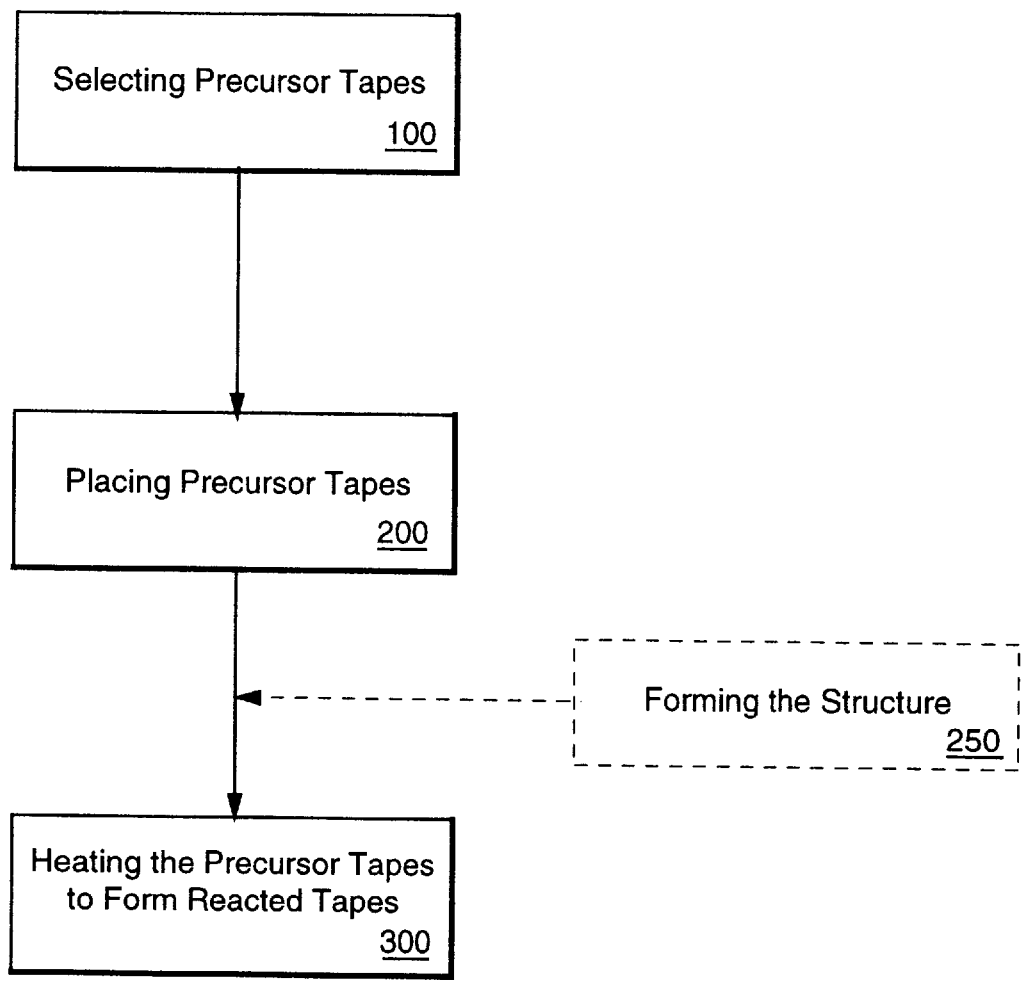
FIG. 3 is a flow diagram describing the method of the invention.

FIG. 3 illustrates the steps of a method of making a superconductive article 10. Referring to FIGS. 1–3, the method briefly comprises: selecting 100 a first metallic precursor tape 15' having a plurality of integrally formed tabs 25 extending from an inner edge 30 and a second metallic precursor tape 35' having a flat edge 45; placing 200 said first precursor tape 15' together with said second precursor tape 35' so that a plurality of portions of the flat edge 45 of said second precursor tape abut the inner edge 30 of said first precursor tape 15' and said second precursor tape 35' is woven in an alternating over/under pattern 50 between the integrally formed tabs 25 of said first precursor tape; and heating 300 the first precursor tape 15' and the second precursor tape 35' together at a temperature and for a time sufficient to cause them to form a first tape 15 having a first superconductive portion 20, a second tape 35 having a second superconductive portion 40, a plurality of superconductive butt joints 80 electrically connecting the first superconductive portion 20 and the second superconductive portion 40 where the inner edge 30 of the first tape and the flat edge 45 of the second tape 35 abut, and a plurality of metallurgical bonds (not shown) between the plurality of integrally formed tabs 25 and the second tape 35. Optionally, this method may also comprise the additional step of forming 250 the structure comprising the plurality of first precursor tapes 15' and plurality of second precursor tapes 35' prior to the step of heating 300.

An alternate method comprises the same steps of selecting 100, placing 200 and heating 300, but does not depend on the formation of a superconductive butt joint rather, this method adds a separate step of forming (not shown) a means for electrically connecting 70 in the form of a superconductive interconnection 85 between the tabs 25 of first tape 15 and second tape 35.

In one embodiment shown in FIGS. 2 and 2A, an unreacted article of the present invention is shown after placing 200 the precursor tapes into a flat, planar array. First precursor tape 15' and second precursor tape 35' may be any precursor materials for a metallic superconductive material, but have been selected for this illustrative embodiment to be niobium-base alloys as described above as a parent-metal 90, having a tin or tin alloy as a reactive-metal coating 100. These tapes are placed 200 in an unreacted state, because it is known that the $Nb_3Sn$ in reacted tapes is brittle. In the embodiment of FIG. 2, the inner edge 30 of first precursor tape 15' abuts the flat edge 45 of second precursor tape 35' in those portions of flat edge 45 that lie between tabs 25 in a repeating pattern. The spacing of tabs 25 may be selected so as to optimize the total length over which first precursor tape 15' and second precursor tape 35' abut one another, because the regions where they abut will become the plurality of superconductive butt joints. Second tape 35 is woven in an alternating pattern 50 between tabs 25. The pattern does not need to be over/under/over as shown, although this pattern is preferred. Placing 200 may be done using any suitable placing means and/or methods, including placing by hand. It may also be desirable to provide mechanical deformation, staking, clamping fixtures or some other method or means of holding first tape 15 in abutting contact with second tape 35.

The present invention also comprises the combination of a plurality of first tapes 15 and second tapes 35 using the same methods described above to join and interconnect first tape 15 and second tape 35.

In the placed and unreacted state, an array comprising precursor tapes 15' and 35', or a plurality of them may optionally be formed 250 into any number of known shapes that may be formed from such an array, including for example a right circular cylinder or a cone. However, if forming is utilized, it will probably be desirable to utilize a means for holding the tapes in abutting contact as described above.

Once placing 200 and any desired forming 250 is done, the first precursor tape 15' and the second precursor tape 35' may be reacted using the methods described herein by heating 300 to form first tape 15 and second tape 35 comprising superconductive $Nb_3Sn$. Heating 300 also forms a plurality of metallurgical bonds between plurality of tabs 25 and second tape 35 by the reflow of the tin coating 130 remaining on the surface of tabs 25 and second tape 35. Heating 300 also forms a superconductive interconnection means 70 in the form of butt joint 80 by the same reaction that forms $Nb_3Sn$ in first tape 15 and second tape 35 as described herein. Butt joints 80 electrically interconnect the superconductive portion 20 of first tape 15 with the superconductive portion 40 of second tape 35. This superconductive interconnection means 70 may alternately be a TIG weld 85 formed in a separate step, as described herein. Further, this separate step may also be utilized in conjunction with the method described above, such that means for electrically connecting 70 comprises a plurality of superconductive butt joints 80 and TIG welds 85. One advantage of the TIG welds 85 is that they also comprise a means for joining the first tape 15 and second tape 35. The formation of these superconductive interconnections make article 10, taken as a whole, superconductive via a continuous layer of $Nb_3Sn$ that connects the superconductive $Nb_3Sn$ 20 of first tapes 15 with the superconductive $Nb_3Sn$ 40 of second tapes 35.

The superconductive interconnections 85 and the method of forming these superconductive interconnections 85 are similar to those described in U.S. Pat. Nos. 5,109,593, 5,134,040 and 5,239,156, which are hereby incorporated by reference. However, rather than forming butt joint interconnections as described in the referenced patents, it is possible to form through-hole superconductive interconnections 85 by using a combination of an upper and a lower copper chill plate (not shown). These chill plates each contain a bore that extends through the plate. In use, the chill plates are aligned such that the bores in the two plates are directly in line with one another, with an overlapping region of tab 25 and a second tape 35 pressed in between so as to establish good thermal contact between the chill plates and the tapes, thereby allowing the chill plates to dissipate heat produced during the formation of the superconductive interconnection 85. A tungsten inert gas (TIG) welding electrode and apparatus may then be utilized to melt the portion of the overlapping region that is exposed within the bores of the chill plates. The TIG arrangement permits this melting to be done in an protective atmosphere, such as an argon atmosphere. The zone within the bore is melted, and surface tension and other effects cause the molten material to pull back forming a ring of material that resolidifies upon cooling. The ring of resolidified material comprises Nb$_3$Sn layer 140 that connects first tape 15 and second tape 35 to form superconductive interconnection 85. It is also known to form welds of the type described herein using other means for forming the weld, such as laser welding.

The degree of superconductivity of an article 10 can be varied by the number, size and spacing of the plurality of superconductive butt joints 80 and/or TIG welds 85 that are formed. For example, if the article 10 is used as a magnetic shield, increasing the spacing of the superconductive interconnections 80 and/or 85 may increase the path length of induced surface currents, particularly in situations where such currents seek to follow a path that may not be contained within a particular tape, thus requiring cross-over from a tape oriented in one direction to a tape oriented in a different direction through a superconductive interconnection 50.

EXAMPLE 1

A plurality of one inch wide, 25 micron thick niobium tapes were used to form an article of the present invention. The composition of these tapes was approximately 1 atom percent zirconium, 2 atom percent oxygen and a balance of niobium. These tapes were coated with a layer of a tin-copper alloy by brief immersion in a molten bath that was held at a temperature of about 1050° C. The bath comprised about 10 weight percent copper with a balance of tin. The plurality of coated but unreacted tapes were then woven into a configuration similar to that shown in FIG. 2. After weaving, the tapes were reacted by heating in an argon atmosphere at about 1050° C. for 220 seconds. After reaction, the reacted tapes had a remaining core of the original niobium alloy that ranged between 5.4 and 19.4 microns in thickness, because the process had not been optimized to make the reaction uniform. It would have been preferred to control the thickness of the remaining core to approximately 10–13 microns in thickness. The thickness of the Nb$_3$Sn reaction layers on either side of the core was between 3–10 microns because of the non-optimized reaction process. A thickness of 6–8 microns would have been more preferred. The outer layers of remaining tin-copper alloy were approximately 2–3 microns thick. The reacted tapes were then interconnected in a plurality of the overlapping regions using chill plates and a TIG welding apparatus as described above to produce a superconductive article. This example demonstrated the formation of a TIG weld, and is analogous to forming such a weld between a tab and the second tape.

EXAMPLE 2

The superconductive character of the interconnections was also tested to ensure that the articles were truly superconductive. This was done by overlapping pieces of 10.3 mm wide reacted tape and forming a plurality of interconnections having different diameters between them using the TIG welding method described above. The critical currents of these interconnections were then measured at a temperature of 4.2° K. in a magnetic field of 5T. The resulting data are shown in Table 1 below:

TABLE 1

| Interconnection Dia. (Bore Dia.) (mm) | Critical Current (Ic) (amps) |
| --- | --- |
| 4.8 | >600 |
| 4.1 | 485 |
| 2.8 | 345 |
| 2.0 | 350 |

This data indicates that the interconnections formed using a combination of TIG welding and chill plates are truly superconductive, and that a plurality of such interconnections may be used to form superconductive articles of the present invention.

What is claimed is:

1. A superconductive article, comprising:
   a first metallic tape having a first superconductive portion and a plurality of integrally formed tabs extending from an inner edge thereof;
   a second metallic tape having a second superconductive portion and a flat edge, wherein said flat edge abuts said inner edge of said first metallic tape and is woven in an alternating over/under pattern between said integrally formed tabs; and
   at least one metallurgical bond joining said first tape to said second tape, said at least one metallurgical bond being formed at said inner edge of said first tape, and at said flat edge of said second metallic tape where said flat edge abuts said inner edge and is woven in the alternating over/under pattern between said integrally formed tabs;
   wherein said at least one metallurgical bond electrically interconnects said first superconductive portion with said second superconductive portion.

2. The superconductive article of claim 1, wherein said first tape and said second tape are both selected from the group consisting of niobium-base, tantalum-base, technetium-base and vanadium-base alloys with at least one alloy constituent from the group consisting of tin, aluminum, silicon and gallium.

3. The superconductive article of claim 1, wherein said first tape and said second tape both comprise an alloy of up to about 5 atomic percent zirconium, up to about 10 atomic percent oxygen and a balance of niobium coated with an alloy comprising up to about 40 atomic percent copper and the balance tin.

4. The superconductive article of claim 1, wherein said first tape and said second tape both comprise Nb$_3$Sn.

5. The superconductive article of claim 1, wherein said at least one metallurgical bond comprises at least one butt joint, which is formed between said inner edge of said first tape and corresponding portions of said flat edge of said second tape, and a plurality of superconductive welds, which join a portion of the plurality of tabs of said first tape to said second tape.

6. The superconductive article of claim 1, further comprising a plurality of said first tapes and a plurality of said second tapes, wherein said flat edge of each of said plurality of said second tapes abuts said inner edge of each of said plurality of said first tapes respectively, and is woven in an alternating over/under pattern between said integrally formed tabs, and wherein a metallurgical bond electrically interconnects said first superconductive portion of each of said plurality of said first tapes with said second superconductive portion of each of said plurality of said second tapes, respectively.

* * * * *